United States Patent
Lin et al.

(10) Patent No.: US 9,425,740 B2
(45) Date of Patent: Aug. 23, 2016

(54) MIXER CIRCUIT

(71) Applicant: National Chi Nan University, Puli, Nantou (TW)

(72) Inventors: Yo-Sheng Lin, Nantou (TW); Guo-Hao Li, Nantou (TW)

(73) Assignee: NATIONAL CHI NAN UNIVERSITY, Puli, Nantou (TW)

(*) Notice: Subject to any disclaimer, the term of this patent is extended or adjusted under 35 U.S.C. 154(b) by 0 days.

(21) Appl. No.: 14/662,442

(22) Filed: Mar. 19, 2015

(65) Prior Publication Data

US 2016/0079922 A1    Mar. 17, 2016

(30) Foreign Application Priority Data

Sep. 12, 2014    (TW) .............................. 103131614 A

(51) Int. Cl.
*H04B 1/28* (2006.01)
*H03D 7/14* (2006.01)

(52) U.S. Cl.
CPC ........... *H03D 7/1441* (2013.01); *H03D 7/1458* (2013.01); *H03D 2200/0023* (2013.01)

(58) Field of Classification Search
None
See application file for complete search history.

(56) References Cited

U.S. PATENT DOCUMENTS 6,396,330 B1 * 5/2002 Fujii .................... H03D 7/1425
   327/355
8,175,199 B2 * 5/2012 Nakatani ................. H03L 7/099
   331/4

OTHER PUBLICATIONS

Ning Zhang et al., entitled "W-Band Active Down-Conversion Mixer in Bulk CMOS," in IEEE Microwave and Wireless Components Letters, vol. 19, No. 2, pp. 98-100, Feb. 2009.
J. Kim et al., entitled "W-band double-balanced down-conversion mixer with Marchand baluns in silicon-germanium technology," in Electronics Letters, vol. 45, No. 16, pp. 841-843, Jul. 30, 2009.

* cited by examiner

*Primary Examiner* — Long Nguyen
(74) *Attorney, Agent, or Firm* — Merchant & Gould P.C.

(57) ABSTRACT

A mixer circuit includes a single-ended to differential converter, first and second transistors, first to fourth inductive transmission lines, and a mixer. The first and second transistors receive a differential input voltage signal pair from the single-ended to differential converter and generate a differential input current signal pair. The mixer mixes the differential input current signal pair with a differential oscillatory voltage signal pair. The first and second inductive transmission lines are configured such that an equivalent input impedance seen into the first and second transistors matches an equivalent output impedance seen into the first single-ended to differential converter.

12 Claims, 5 Drawing Sheets

MIXER CIRCUIT

CROSS-REFERENCE TO RELATED APPLICATION

This application claims priority of Taiwanese Application No. 103131614, filed on Sep. 12, 2014.

FIELD OF THE INVENTION

This invention relates to a circuit, and more particularly to a mixer circuit.

BACKGROUND OF THE INVENTION

A conventional mixer circuit proposed in an article by N. Zhang et al., entitled "W-Band Active Down-Conversion Mixer in Bulk CMOS," in *IEEE Microwave and Wireless Components Letters*, vol. 19, no. 2, pp. 98-100, February 2009, operates in a 76 GHz-77 GHz frequency band, and achieves low power consumption. However, its conversion gain is only −8 dB, and its LO-RF isolation and LO-IF isolation are both low, where LO, RF and IF respectively denote a local oscillator signal input terminal, a radio frequency signal input terminal and an intermediate frequency signal output terminal.

Another conventional mixer circuit proposed in an article by J. Kim et al., entitled "W-band double-balanced down-conversion mixer with Marchand baluns in silicon-germanium technology," in *Electronics Letters*, vol. 45, no. 16, pp. 841-843, July 2009, operates in a 75 GHz-110 GHz frequency band, and has a conversion gain of 14.4 dB. However, its power consumption is high, and its LO-RF isolation is low.

Measurement results of the above-mentioned conventional mixer circuits are shown in Table 1. It is known from Table 1 that each conventional mixer circuit is unable to simultaneously achieve low power consumption and high conversion gain.

TABLE 1

|  | N. Zhang | J. Kim |
| --- | --- | --- |
| Conversion Gain (dB) | −8 | 14.4 |
| LO-RF Isolation (dB) | 21 | 30 |
| LO-IF Isolation (dB) | 32 | — |
| RF-IF Isolation (dB) | — | — |
| Power Consumption (mW) | 6 | 92.4 |
| FOM (figure of merit) | $1.01 \times 10^{-4}$ | $0.178 \times 10^{-4}$ |

SUMMARY OF THE INVENTION

Therefore, an object of the present invention is to provide a mixer circuit that can overcome the aforesaid drawback associated with the prior art.

According to one aspect of this invention, a mixer circuit includes a first single-ended to differential converter, a first transistor, a second transistor, a first inductive transmission line, a second inductive transmission line, a third inductive transmission line, a fourth inductive transmission line and a mixer.

The first single-ended to differential converter has an input terminal adapted for receiving an input voltage signal, a first output terminal and a second output terminal. The first single-ended to differential converter converts the input voltage signal into a differential input voltage signal pair including a first voltage signal and a second voltage signal, and outputs the first and second voltage signals respectively at the first and second output terminals.

The first transistor has a first terminal for providing a first current signal, a second terminal, and a control terminal coupled to the first output terminal of the first single-ended to differential converter for receiving the first voltage signal therefrom.

The second transistor has a first terminal for providing a second current signal, a second terminal, and a control terminal coupled to the second output terminal of the first single-ended to differential converter for receiving the second voltage signal therefrom. The first and second current signals cooperatively constitute a differential input current signal pair.

The first inductive transmission line has a first terminal coupled to the second terminal of the first transistor, and a second terminal.

The second inductive transmission line has a first terminal coupled to the second terminal of the first inductive transmission line, and a second terminal coupled to the second terminal of the second transistor.

The third inductive transmission line has a first terminal, and a second terminal coupled to the first terminal of the first transistor.

The fourth inductive transmission line has a first terminal, and a second terminal coupled to the first terminal of the second transistor.

The mixer receives a differential oscillatory voltage signal pair, and is coupled to the first terminals of the third and fourth inductive transmission lines for receiving the differential input current signal pair through the third and fourth inductive transmission lines. The mixer mixes the differential input current signal pair with the differential oscillatory voltage signal pair to obtain a differential mixed voltage signal pair.

The first and second inductive transmission lines are configured such that an equivalent input impedance seen into the first and second transistors from the control terminals thereof matches an equivalent output impedance seen into the first single-ended to differential converter from the first and second output terminals thereof.

According to another aspect of this invention, a mixer circuit includes a first transistor, a second transistor, a first inductive transmission line, a second inductive transmission line and a mixer.

Each of the first transistor and the second transistor has a first terminal, a second terminal and a control terminal. The control terminals of the first and second transistors are disposed to receive a differential input voltage signal pair. The first terminals of the first and second transistors cooperatively provide a differential input current signal pair.

Each of the first inductive transmission line and the second inductive transmission line has a first terminal, and a second terminal coupled to a respective one of the first terminals of the first and second transistors.

The mixer is disposed to receive a differential oscillatory voltage signal pair, is coupled to the first terminals of the first and second inductive transmission lines for receiving the differential input current signal pair therethrough, and is configured to mix the differential input current signal pair with the differential oscillatory voltage signal pair.

The first and second inductive transmission lines are configured to compensate a frequency pole resulting from parasitic capacitances of the mixer, the first transistor and the second transistor.

According to yet another aspect of this invention, the mixer circuit includes a single-ended to differential converter, a first transistor, a second transistor, a first inductive transmission line, a second inductive transmission line and a mixer.

The single-ended to differential converter is adapted for receiving an input voltage signal, and converting the input voltage signal into a differential input voltage signal pair.

Each of the first transistor and the second transistor has a first terminal, a second terminal and a control terminal. The control terminals of the first and second transistors are coupled to the single-ended to differential converter to cooperatively receive the differential input voltage signal pair therefrom. The first terminals of the first and second transistors cooperatively provide a differential input current signal pair.

The first inductive transmission line has a first terminal coupled to the second terminal of the first transistor, and a second terminal.

The second inductive transmission line has a first terminal coupled to the second terminal of the first inductive transmission line, and a second terminal coupled to the second terminal of the second transistor.

The mixer is disposed to receive a differential oscillatory voltage signal pair, is coupled to the first terminals of the first and second transistors for receiving the differential input current signal pair therefrom, and is configured to mix the differential input current signal pair with the differential oscillatory voltage signal pair.

The first and second inductive transmission lines are configured such that an equivalent input impedance seen into the first and second transistors from the control terminals thereof matches an equivalent output impedance of the single-ended to differential converter.

BRIEF DESCRIPTION OF THE DRAWINGS

Other features and advantages of the present invention will become apparent in the following detailed description of the embodiment with reference to the accompanying drawings, in which.

DETAILED DESCRIPTION OF THE EMBODIMENT

Figure 1:
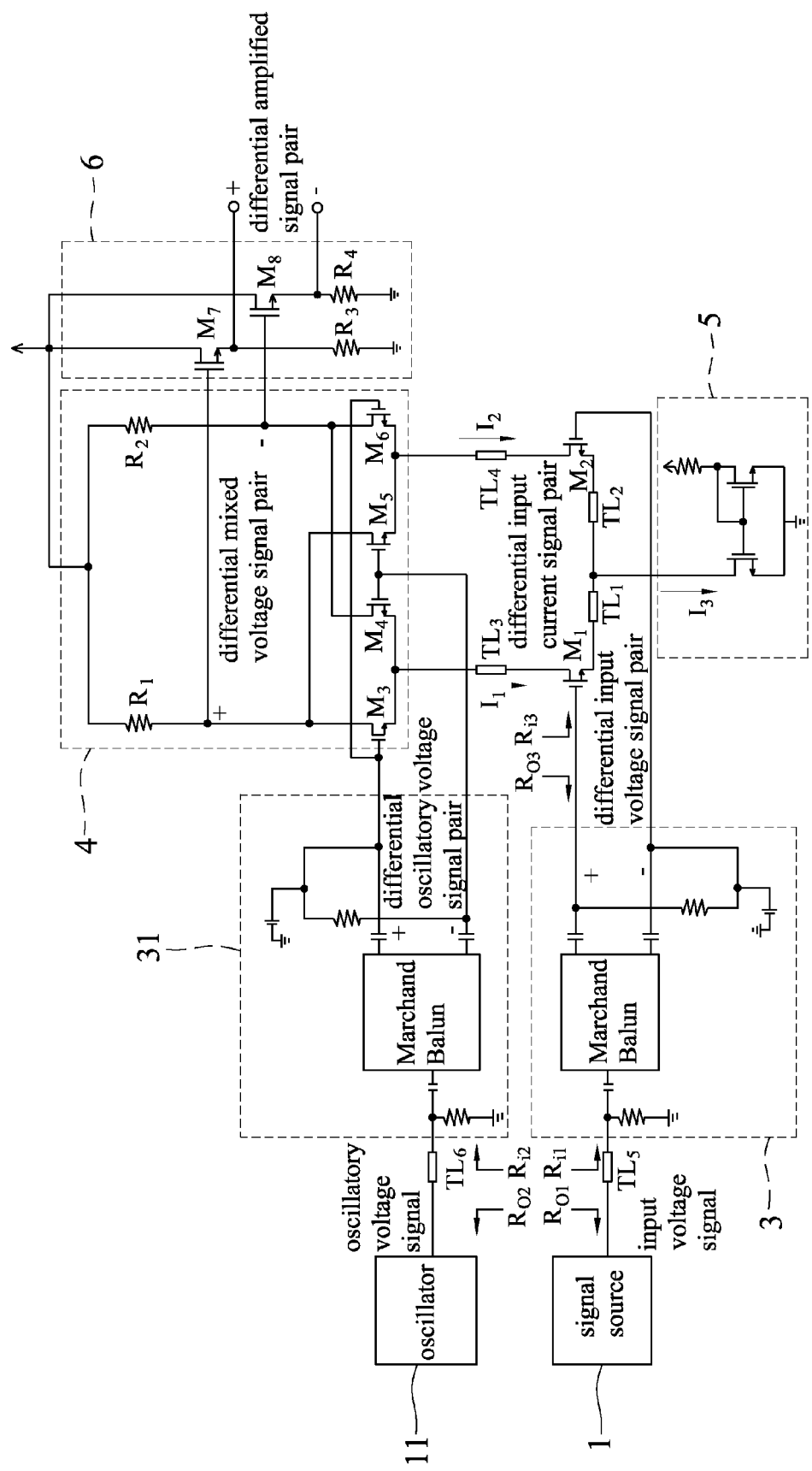
FIG. 1 is a circuit block diagram illustrating an embodiment of a mixer circuit according to this invention.

Referring to FIG. 1, an embodiment of a mixer circuit according to this invention is adapted to be coupled to an oscillator 11 that generates an oscillatory voltage signal, and a signal source 1 that generates an input voltage signal. In this embodiment, the input voltage signal is a signal of radio frequency. However, in other embodiments, the input voltage signal may be a signal of other frequencies.

The mixer circuit of this embodiment includes a first single-ended to differential converter 3, a second single-ended to differential converter 31, a first transistor ($M_1$), a second transistor ($M_2$), a first inductive transmission line ($TL_1$), a second inductive transmission line ($TL_2$), a third inductive transmission line ($TL_3$), a fourth inductive transmission line ($TL_4$), a fifth inductive transmission line ($TL_5$), a sixth inductive transmission line ($TL_6$), a mixer 4, a current source 5 and an amplifier 6.

The fifth inductive transmission line ($TL_5$) has a first terminal adapted to be coupled to the signal source 1 for receiving the input voltage signal therefrom, and a second terminal. The fifth inductive transmission line ($TL_5$) is configured such that an equivalent input impedance ($R_{i1}$) seen into the fifth inductive transmission line ($TL_5$) from the first terminal thereof matches an equivalent output impedance ($R_{o1}$) seen into the signal source 1.

The first single-ended to differential converter 3 has an input terminal coupled to the second terminal of the fifth inductive transmission line ($TL_5$) for receiving the input voltage signal through the fifth inductive transmission line ($TL_5$), a first output terminal and a second output terminal. The first single-ended to differential converter 3 converts the input voltage signal into a differential input voltage signal pair including a first voltage signal and a second voltage signal, and outputs the first and second voltage signals respectively at the first and second output terminals.

The first transistor ($M_1$) has a first terminal for providing a first current signal ($I_1$), a second terminal, and a control terminal coupled to the first output terminal of the first single-ended to differential converter 3 for receiving the first voltage signal therefrom.

The second transistor ($M_2$) has a first terminal for providing a second current signal ($I_2$), a second terminal, and a control terminal coupled to the second output terminal of the first single-ended to differential converter 3 for receiving the second voltage signal therefrom. The first and second current signals ($I_1$, $I_2$) cooperatively constitute a differential input current signal pair. In this embodiment, each of the first and second transistors ($M_1$, $M_2$) is an N-type metal oxide semiconductor field effect transistor.

The first inductive transmission line ($TL_1$) has a first terminal coupled to the second terminal of the first transistor ($M_1$), and a second terminal.

The second inductive transmission line ($TL_2$) has a first terminal coupled to the second terminal of the first inductive transmission line ($TL_1$), and a second terminal coupled to the second terminal of the second transistor ($M_2$). The first and second inductive transmission lines ($TL_1$, $TL_2$) are configured such that an equivalent input impedance ($R_{i3}$) seen into the first and second transistors ($M_1$, $M_2$) from the control terminals thereof matches an equivalent output impedance ($R_{o3}$) seen into the first single-ended to differential converter 3 from the first and second output terminals thereof.

The third inductive transmission line ($TL_3$) has a first terminal, and a second terminal coupled to the first terminal of the first transistor ($M_1$).

The fourth inductive transmission line ($TL_4$) has a first terminal, and a second terminal coupled to the first terminal of the second transistor ($M_2$).

The sixth inductive transmission line ($TL_6$) has a first terminal adapted to be coupled to the oscillator 11 for receiving the oscillatory voltage signal therefrom, and a second terminal. The sixth inductive transmission line ($TL_6$) is configured such that an equivalent input impedance ($R_{i2}$) seen into the sixth inductive transmission line ($TL_6$) from the first terminal thereof matches an equivalent output impedance ($R_{o2}$) seen into the oscillator 11.

The second single-ended to differential converter 31 has an input terminal that is coupled to the second terminal of the sixth inductive transmission line ($TL_6$) for receiving the oscillatory voltage signal through the sixth inductive transmission line ($TL_6$), a first output terminal and a second output terminal. The second single-ended to differential converter 31 converts the oscillatory voltage signal into a differential oscillatory voltage signal pair including a first oscillatory voltage signal and a second oscillatory voltage signal, and outputs the first and second oscillatory voltage signals respectively at the first and second output terminals thereof. In this embodiment, each of the first and second single-ended to differential converters 3, 31 includes a Marchand Balun, multiple resistors and multiple capacitors.

The mixer 4 is coupled to the first and second output terminals of the second single-ended to differential converter 31 for receiving the differential oscillatory voltage signal pair therefrom, and further coupled to the first terminals of the third and fourth inductive transmission lines ($TL_3$, $TL_4$) for receiving the differential input current signal pair through the third and fourth inductive transmission lines ($TL_3$, $TL_4$). The mixer 4 mixes the differential input current signal pair with the differential oscillatory voltage signal pair to obtain a differential mixed voltage signal pair. The differential mixed voltage signal pair includes a first mixed voltage signal and a second mixed voltage signal. In this embodiment, the mixer 4 includes a third transistor ($M_3$), a fourth transistor ($M_4$), a fifth transistor ($M_5$), a sixth transistor ($M_6$), a first resistor ($R_1$) and a second resistor ($R_2$).

The third transistor ($M_3$) has a first terminal for outputting the first mixed voltage signal, a second terminal coupled to the first terminal of the third inductive transmission line ($TL_3$) for receiving the first current signal ($I_1$) of the differential input current signal pair through the third inductive transmission line ($TL_3$), and a control terminal coupled to the first output terminal of the second single-ended to differential converter 31 for receiving the first oscillatory voltage signal of the differential oscillatory voltage signal pair therefrom.

The fourth transistor ($M_4$) has a first terminal for outputting the second mixed voltage signal, a second terminal coupled to the second terminal of the third transistor ($M_3$), and a control terminal coupled to the second output terminal of the second single-ended to differential converter 31 for receiving the second oscillatory voltage signal of the differential oscillatory voltage signal pair therefrom.

The fifth transistor ($M_5$) has a first terminal coupled to the first terminal of the third transistor ($M_3$), a second terminal coupled to the first terminal of the fourth inductive transmission line ($TL_4$) for receiving the second current signal of the differential input current signal pair through the fourth inductive transmission line ($TL_4$), and a control terminal coupled to the control terminal of the fourth transistor ($M_4$).

The sixth transistor ($M_6$) has a first terminal coupled to the first terminal of the fourth transistor ($M_4$), a second terminal coupled to the second terminal of the fifth transistor ($M_5$), and a control terminal coupled to the control terminal of the third transistor ($M_3$). In this embodiment, each of the third to sixth transistors ($M_3$~$M_6$) is an N-type metal oxide semiconductor field effect transistor.

The first resistor ($R_1$) has a first terminal adapted for receiving a direct current bias voltage, and a second terminal coupled to the first terminal of the third transistor ($M_3$).

The second resistor ($R_2$) has a first terminal coupled to the first terminal of the first resistor ($R_1$), and a second terminal coupled to the first terminal of the fourth transistor ($M_4$).

The current source 5 is coupled to the second terminal of the first inductive transmission line ($TL_1$) for providing a bias current ($I_3$) thereto.

The amplifier 6 is coupled to the mixer 4, and amplifies the differential mixed voltage signal pair from the mixer 4 to generate a differential amplified signal pair for a load (not shown). The differential amplified signal pair includes a first amplified voltage signal and a second amplified voltage signal. In this embodiment, the amplifier 6 is a source follower amplifier, and includes a seventh transistor ($M_7$), an eighth transistor ($M_8$), a third resistor ($R_3$) and a fourth resistor ($R_4$).

The seventh transistor ($M_7$) has a first terminal adapted for receiving the direct current bias voltage, a second terminal for outputting the first amplified voltage signal, and a control terminal coupled to the first terminal of the third transistor ($M_3$) of the mixer 4 for receiving the first mixed voltage signal of the differential mixed voltage signal pair therefrom.

The third resistor ($R_3$) is coupled between the second terminal of the seventh transistor ($M_7$) and ground.

The eighth transistor ($M_8$) has a first terminal coupled to the first terminal of the seventh transistor ($M_7$), a second terminal for outputting the second amplified voltage signal, and a control terminal coupled to the first terminal of the fourth transistor ($M_4$) of the mixer 4 for receiving the second mixed voltage signal of the differential mixed voltage signal pair therefrom. The second terminals of the seventh and eighth transistors ($M_7$, $M_8$) serve as an output end of the amplifier 6. In this embodiment, each of the seventh and eighth transistors ($M_7$, $M_8$) is an N-type metal oxide semiconductor field effect transistor.

The fourth resistor ($R_4$) is coupled between the second terminal of the eighth transistor ($M_8$) and ground.

In this embodiment, the amplifier 6 is configured such that an equivalent input impedance seen into the amplifier 6 from the control terminals of the seventh and eighth transistors ($M_7$, $M_8$) is higher than an equivalent input impedance seen into the load, thereby preventing decrease of an output power of the mixer circuit and thus reducing load effect. In addition, since each of the input voltage signal and the oscillatory voltage signal is sequentially processed in multiple stages (including at least the corresponding single-ended to differential converter 3, 31, the mixer 4 and the amplifier 6) so as to generate the differential amplified signal pair, isolation between the first terminal of the fifth inductive transmission line ($TL_5$) and the output end of the amplifier 6 and isolation between the first terminal of the sixth inductive transmission line ($TL_6$) and the output end of the amplifier 6 are relatively high.

Figure 2:
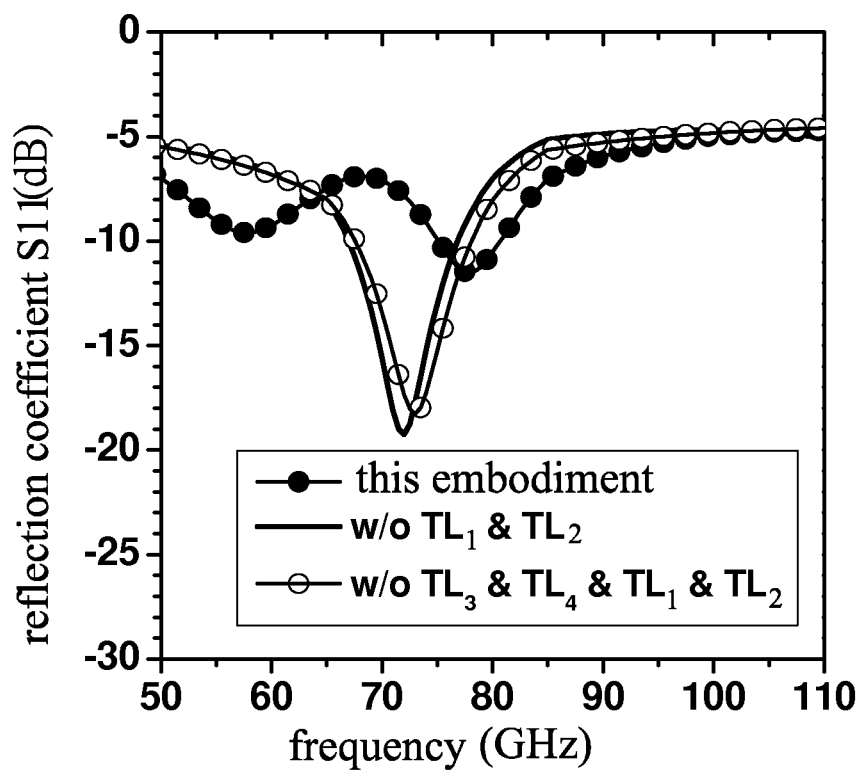
FIG. 2 is a schematic diagram illustrating reflection coefficient S11 versus frequency characteristic in various conditions.
Figure 3:
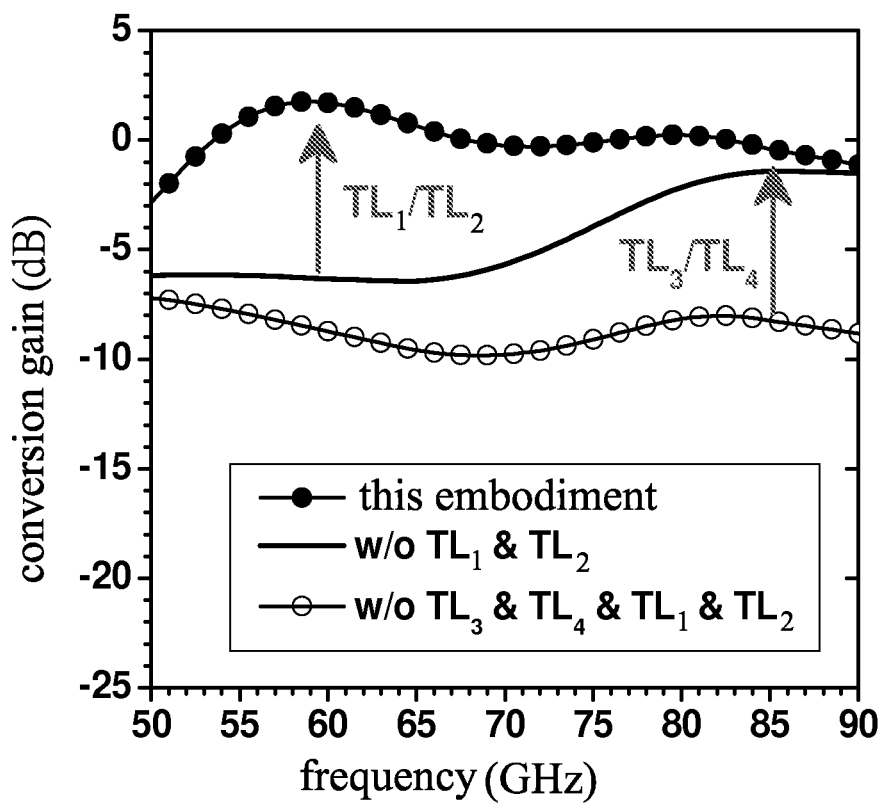
FIG. 3 is a schematic diagram illustrating conversion gain versus frequency characteristic in various conditions.

FIG. 2 illustrates reflection coefficient S11 versus frequency characteristic obtained from the first terminal of the fifth inductive transmission line ($TL_5$) in various conditions, and FIG. 3 illustrates conversion gain versus frequency characteristic in various conditions. It is known from FIG. 2 that at 60 GHz, the reflection coefficient S11 is lower in this embodiment than in conditions without the first and second inductive transmission lines ($TL_1$, $TL_2$). In other words, at 60 GHz, the match of the impedances ($R_{i3}$, $R_{o3}$) due to the first and second inductive transmission lines ($TL_1$, $TL_2$) can reduce reflection losses and thus increase a conversion gain of this embodiment as shown in FIG. 3.

It is known from FIG. 3 that at 85 GHz, the conversion gain is higher in this embodiment than in a condition without the third and fourth inductive transmission lines ($TL_3$, $TL_4$). Each of the first to sixth transistors ($M_1$~$M_6$) has a respective first parasitic capacitance between the control and second terminals thereof and a respective second parasitic capacitance between the first and second terminals thereof. In the condition without the third and fourth inductive transmission lines ($TL_3$, $TL_4$), frequency poles are generated due to the parasitic capacitances of the first to sixth transistors ($M_1$~$M_6$), and cause the conversion gain to decrease with increasing frequency. In this embodiment, the third and fourth inductive transmission lines ($TL_3$, $TL_4$) resonate with the parasitic capacitances of the first to sixth transistors ($M_1$~$M_6$) to compensate the aforesaid frequency poles, thereby increasing the conversion gain thereat.

Figure 4:
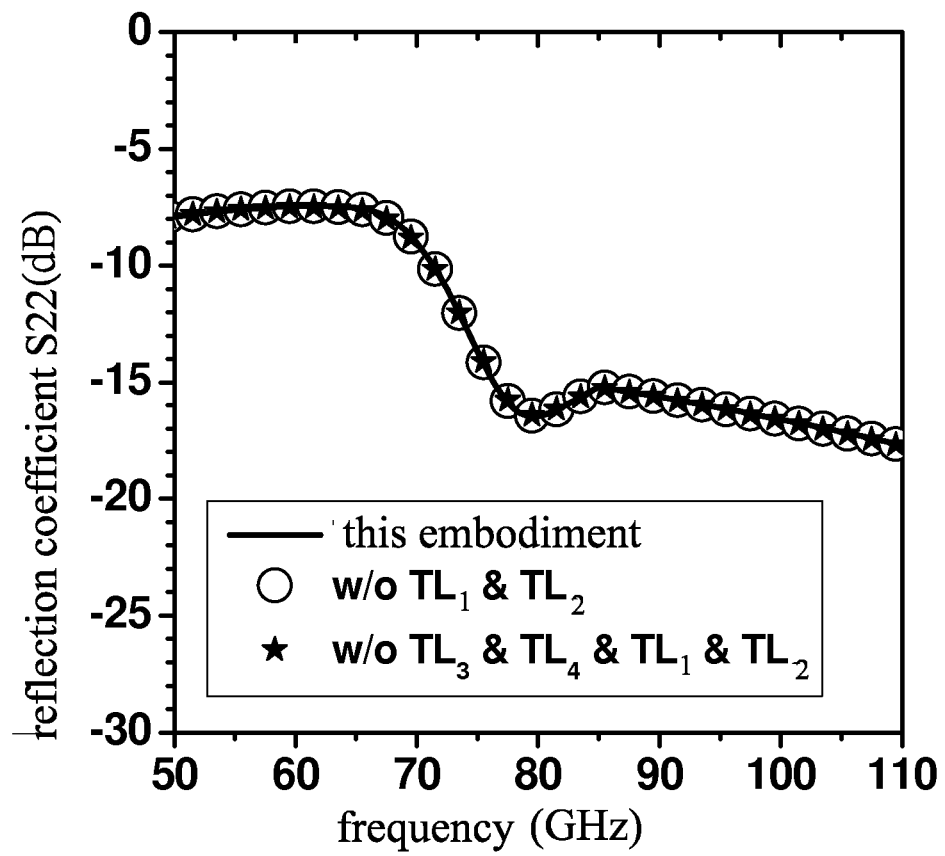
FIG. 4 is a schematic diagram illustrating reflection coefficient S22 versus frequency characteristic in various conditions.

FIG. 4 illustrates reflection coefficient S22 versus frequency characteristic obtained from the first terminal of the sixth inductive transmission line ($TL_6$) in various conditions. Since a relatively large number of components are located in a signal path between the first terminal of the sixth inductive transmission line ($TL_6$) and the second terminal of each of the third and fifth transistors ($M_3$, $M_5$) (including the sixth inductive transmission line ($TL_6$), the second single-ended to differential converter 31 and the corresponding one of the third and fifth transistors ($M_3$, $M_5$)), the second terminals of the third and fifth transistors ($M_3$, $M_5$) could be regarded as being virtually grounded when evaluating the equivalent input impedance ($R_{i2}$) seen into the sixth inductive transmission line ($TL_6$) from the first terminal thereof. Thus, the reflection coefficient S22 is not affected by the first to fourth inductive transmission lines ($TL_1$~$TL_4$).

Figure 5:
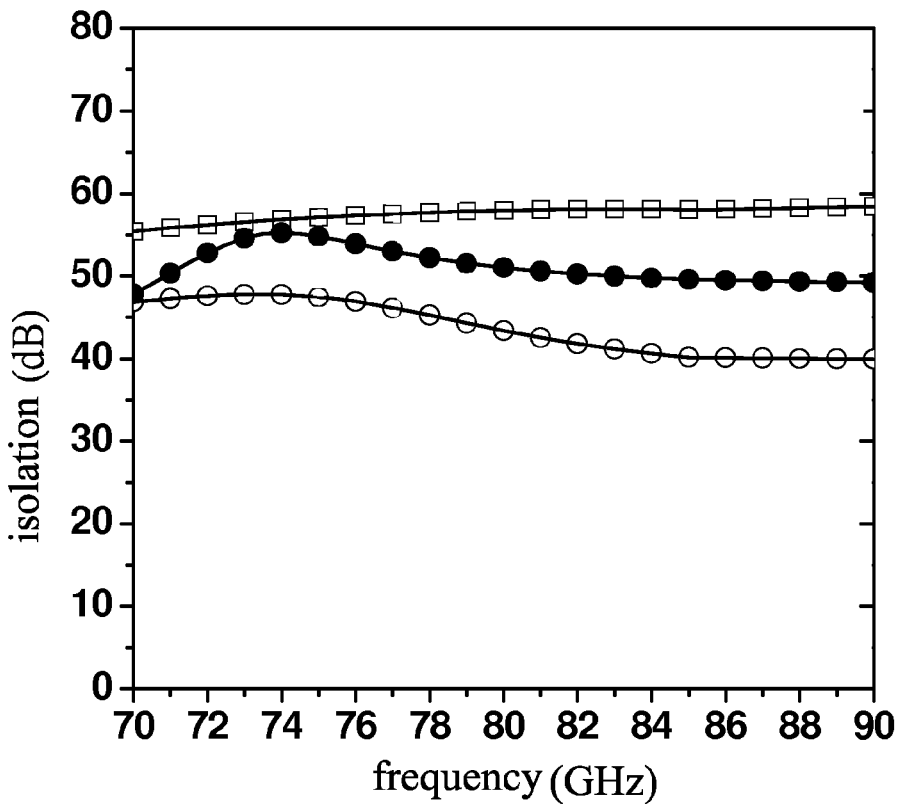
FIG. 5 is a schematic diagram illustrating various isolations versus frequency characteristics of the embodiment.

FIG. 5 illustrates various isolations versus frequency characteristics of this embodiment. In FIG. 5, isolation between the first terminals of the fifth and sixth inductive transmission lines ($TL_5$, $TL_6$), the isolation between the first terminal of the sixth inductive transmission line ($TL_6$) and the output end of the amplifier 6, and the isolation between the first terminal of the fifth transmission line ($TL_5$) and the output end of the amplifier 6 are depicted.

An example of parameters of the components ($M_1$~$M_8$, $R_1$~$R_4$, $TL_1$~$TL_6$) are shown in the following Table 2.

TABLE 2

| M1, M2 | L = 0.1 um, W = 72 um, finger number = 18 |
|---|---|
| M3~M6 | L = 0.1 um, W = 50 um, finger number = 10 |
| M7, M8 | L = 0.1 um, W = 200 um, finger number = 40 |
| R1, R2 | 3421.4 Ω |
| R3, R4 | 39.3 Ω |
| TL1, TL2 | 163.3 pH |
| TL3, TL4 | 75.6 pH |
| TL5, TL6 | 30.6 pH |

Simulation results and measurement results of this embodiment with the components ($M_1$~$M_8$, $R_1$~$R_4$, $TL_1$~$TL_6$) having the parameters shown in Table 2 are shown in the following Table 3, where the oscillatory voltage signal has a frequency of 78.9 GHz and the input voltage signal has a frequency of 79 GHz.

TABLE 3

|  | Simulation | Measurement |
|---|---|---|
| power of input voltage signal (dBm) | 4 | 5 |
| Conversion gain (dB) | 2 | 1.5 |
| Isolation between first terminals of fifth and sixth inductive transmission lines (dB) | 44.1 | 49.2 |
| Isolation between first terminal of sixth inductive transmission line and output end of amplifier (dB) | 56.5 | 64.5 |
| Isolation between first terminal of fifth inductive transmission line and output end of amplifier (dB) | 45.9 | 39.4 |
| IP1 dB (input 1 dB compression point) (dBm) | −8 | −9 |
| IIP3 (input third order intercept point) (dBm) | 2 | 2.7 |
| NF (noise figure) (GHz) | 21.5 | 23.3 |

TABLE 3-continued

|  | Simulation | Measurement |
|---|---|---|
| Power consumption (mW) | 12.6 | 13 |
| FOM (figure of merit) | — | $1.73 \times 10^{-4}$ |

It is known from Table 3 that the power consumption of the mixer circuit of this embodiment is relatively low and the conversion gain of the same is relatively high compared to the aforesaid conventional mixer circuits.

While the present invention has been described in connection with what is considered the most practical embodiment, it is understood that this invention is not limited to the disclosed embodiment but is intended to cover various arrangements included within the spirit and scope of the broadest interpretation and equivalent arrangements.

What is claimed is:

1. A mixer circuit comprising:

a first single-ended to differential converter having an input terminal adapted for receiving an input voltage signal, a first output terminal and a second output terminal, said first single-ended to differential converter converting the input voltage signal into a differential input voltage signal pair that includes a first voltage signal and a second voltage signal, and outputting the first and second voltage signals respectively at said first and second output terminals;

a first transistor having a first terminal for providing a first current signal, a second terminal, and a control terminal coupled to said first output terminal of said first single-ended to differential converter for receiving the first voltage signal therefrom;

a second transistor having a first terminal for providing a second current signal, a second terminal, and a control terminal coupled to said second output terminal of said first single-ended to differential converter for receiving the second voltage signal therefrom, the first and second current signals cooperatively constituting a differential input current signal pair;

a first inductive transmission line having a first terminal coupled to said second terminal of said first transistor, and a second terminal;

a second inductive transmission line having a first terminal coupled to said second terminal of said first inductive transmission line, and a second terminal coupled to said second terminal of said second transistor;

a third inductive transmission line having a first terminal, and a second terminal coupled to said first terminal of said first transistor;

a fourth inductive transmission line having a first terminal, and a second terminal coupled to said first terminal of said second transistor;

a mixer receiving a differential oscillatory voltage signal pair, and coupled to said first terminals of said third and fourth inductive transmission lines for receiving the differential input current signal pair through said third and fourth inductive transmission lines, said mixer mixing the differential input current signal pair with the differential oscillatory voltage signal pair to obtain a differential mixed voltage signal pair; and a fifth inductive transmission line having a first terminal adapted to be coupled to a signal source for receiving the input voltage signal therefrom, and a second terminal coupled to said input terminal of said first single-ended to differential converter;

wherein said first and second inductive transmission lines are configured such that an equivalent input impedance seen into said first and second transistors from said control terminals thereof matches an equivalent output impedance seen into said first single-ended to differential converter from said first and second output terminals thereof;

wherein an equivalent input impedance seen into said fifth inductive transmission line from said first terminal thereof matches an equivalent output impedance seen into the signal source.

2. The mixer circuit of claim 1, further comprising:
a second single-ended to differential converter having an input terminal that receives an oscillatory voltage signal, and a first output terminal and a second output terminal that are coupled to said mixer, said second single-ended to differential converter converting the oscillatory voltage signal into the differential oscillatory voltage signal pair that includes a first oscillatory voltage signal and a second oscillatory voltage signal, and outputting the first and second oscillatory voltage signals respectively at said first and second output terminals thereof.

3. The mixer circuit of claim 2, further comprising:
a sixth inductive transmission line having a first terminal adapted to be coupled to an oscillator for receiving the oscillatory voltage signal therefrom, and a second terminal coupled to said input terminal of said second single-ended to differential converter;

wherein an equivalent input impedance seen into said sixth inductive transmission line from said first terminal thereof matches an equivalent output impedance seen into the oscillator.

4. The mixer circuit of claim 2, wherein the differential mixed voltage signal pair includes a first mixed voltage signal and a second mixed voltage signal, and said mixer includes:
a third transistor having a first terminal for outputting the first mixed voltage signal, a second terminal coupled to said first terminal of said third inductive transmission line for receiving the first current signal of the differential input current signal pair through said third inductive transmission line, and a control terminal coupled to said first output terminal of said second single-ended to differential converter for receiving the first oscillatory voltage signal of the differential oscillatory voltage signal pair therefrom;

a fourth transistor having a first terminal for outputting the second mixed voltage signal, a second terminal coupled to said second terminal of said third transistor, and a control terminal coupled to said second output terminal of said second single-ended to differential converter for receiving the second oscillatory voltage signal of the differential oscillatory voltage signal pair therefrom;

a fifth transistor having a first terminal coupled to said first terminal of said third transistor, a second terminal coupled to said first terminal of said fourth inductive transmission line for receiving the second current signal of the differential input current signal pair through said fourth inductive transmission line, and a control terminal coupled to said control terminal of said fourth transistor;

a sixth transistor having a first terminal coupled to said first terminal of said fourth transistor, a second terminal coupled to said second terminal of said fifth transistor, and a control terminal coupled to said control terminal of said third transistor;

a first resistor having a first terminal adapted for receiving a direct current bias voltage, and a second terminal coupled to said first terminal of said third transistor; and a second resistor having a first terminal coupled to said first terminal of said first resistor, and a second terminal coupled to said first terminal of said fourth transistor.

5. The mixer circuit of claim 4, wherein each of said third to sixth transistors is an N-type metal oxide semiconductor field effect transistor.

6. The mixer circuit of claim 4, further comprising an amplifier that is coupled to said mixer, and that amplifies the differential mixed voltage signal pair from said mixer to generate a differential amplified signal pair.

7. The mixer circuit of claim 6, wherein the differential amplified signal pair includes a first amplified voltage signal and a second amplified voltage signal, and said amplifier includes:
a seventh transistor having a first terminal adapted for receiving the direct current bias voltage, a second terminal for outputting the first amplified voltage signal, and a control terminal coupled to said first terminal of said third transistor of said mixer for receiving the first mixed voltage signal of the differential mixed voltage signal pair therefrom;

a third resistor coupled between said second terminal of said seventh transistor and ground;

an eighth transistor having a first terminal coupled to said first terminal of said seventh transistor, a second terminal for outputting the second amplified voltage signal, and a control terminal coupled to said first terminal of said fourth transistor of said mixer for receiving the second mixed voltage signal of the differential mixed voltage signal pair therefrom; and a fourth resistor coupled between said second terminal of said eighth transistor and ground.

8. The mixer circuit of claim 7, wherein each of said seventh and eighth transistors is an N-type metal oxide semiconductor field effect transistor.

9. The mixer circuit of claim 1, wherein each of said first and second transistors is an N-type metal oxide semiconductor field effect transistor.

10. The mixer circuit of claim 1, further comprising:
a current source coupled to said second terminal of said first inductive transmission line for providing a bias current thereto.

11. A mixer circuit comprising:
a single-ended to differential converter having an input terminal adapted for receiving an input voltage signal, and converting the input voltage signal into a differential input voltage signal pair;

a first transistor and a second transistor each having a first terminal, a second terminal and a control terminal, said control terminals of said first and second transistors being coupled to said single-ended to differential converter to cooperatively receive the differential input voltage signal pair therefrom, said first terminals of said first and second transistors cooperatively providing a differential input current signal pair;

a first inductive transmission line and a second inductive transmission line each having a first terminal, and a second terminal coupled to a respective one of said first terminals of said first and second transistors;

a mixer disposed to receive a differential oscillatory voltage signal pair, coupled to said first terminals of said first and second inductive transmission lines for receiving the differential input current signal pair therethrough, and configured to mix the differential input current signal pair with the differential oscillatory voltage signal pair; and a third inductive transmission line having a first terminal adapted to be coupled to a signal source for receiving the input voltage signal therefrom, and a second terminal coupled to said input terminal of said single-ended to differential converter;

wherein said first and second inductive transmission lines are configured to compensate a frequency pole resulting from parasitic capacitances of said mixer, said first transistor and said second transistor;

wherein an equivalent input impedance seen into said third inductive transmission line from said first terminal thereof matches an equivalent output impedance seen into the signal source.

12. A mixer circuit comprising:

a single-ended to differential converter having an input terminal adapted for receiving an input voltage signal, and converting the input voltage signal into a differential input voltage signal pair;

a first transistor and a second transistor each having a first terminal, a second terminal and a control terminal, said control terminals of said first and second transistors being coupled to said single-ended to differential converter to cooperatively receive the differential input voltage signal pair therefrom, said first terminals of said first and second transistors cooperatively providing a differential input current signal pair;

a first inductive transmission line having a first terminal coupled to said second terminal of said first transistor, and a second terminal;

a second inductive transmission line having a first terminal coupled to said second terminal of said first inductive transmission line, and a second terminal coupled to said second terminal of said second transistor;

a mixer disposed to receive a differential oscillatory voltage signal pair, coupled to said first terminals of said first and second transistors for receiving the differential input current signal pair therefrom, and configured to mix the differential input current signal pair with the differential oscillatory voltage signal pair; and a third inductive transmission line having a first terminal adapted to be coupled to a signal source for receiving the input voltage signal therefrom, and a second terminal coupled to said input terminal of said single-ended to differential converter;

wherein said first and second inductive transmission lines are configured such that an equivalent input impedance seen into said first and second transistors from said control terminals thereof matches an equivalent output impedance of said single-ended to differential converter, wherein an equivalent input impedance seen into said third inductive transmission line from said first terminal thereof matches an equivalent output impedance seen into the signal source.

* * * * *